United States Patent [19]

Schemmel et al.

[11] Patent Number: 4,485,351

[45] Date of Patent: Nov. 27, 1984

[54] CIRCUIT FOR DERIVING OF SIGNALS AND COUNTER CYCLE SIGNALS FROM ONE SIDED INPUT SIGNAL

[75] Inventors: Hans R. Schemmel; Ingo Reichelt, both of Nuremberg, Fed. Rep. of Germany

[73] Assignee: Philips Kommunikations Industrie AG, Nuremberg, Fed. Rep. of Germany

[21] Appl. No.: 308,538

[22] PCT Filed: Jun. 27, 1981

[86] PCT No.: PCT/EP81/00087
§ 371 Date: Sep. 28, 1981
§ 102(e) Date: Sep. 28, 1981

[87] PCT Pub. No.: WO82/00227
PCT Pub. Date: Jan. 21, 1982

[51] Int. Cl.³ .............................................. H03F 3/04
[52] U.S. Cl. .................................................. 330/288
[58] Field of Search ................ 330/257, 288; 323/315, 323/316

[56] References Cited

U.S. PATENT DOCUMENTS 3,886,466  5/1975  Wheatley, Jr. ...................... 330/288
4,168,472  9/1979  Sugimoto ............................ 330/288

Primary Examiner—James B. Mullins
Assistant Examiner—G. Wan
Attorney, Agent, or Firm—Michael J. Striker

[57] ABSTRACT

The invention relates to a circuit for deriving output of signals and output counter cycle signals from a one-sided input signal.

The circuit contains two transistors coupled to at least one current reflecting circuit. The two outputs of the current reflecting circuit are connected either with the emitters or the collectors of two transistors, whereby one connecting line at least one resistor is disposed. The interconnected bases of each of the two transistors are connected to an adjustable direct-current source. The equal electrodes of the two transistors which are not connected with the current reflection circuit form the signal output and the signal counter cycle output.

6 Claims, 5 Drawing Figures 4,485,351

CIRCUIT FOR DERIVING OF SIGNALS AND COUNTER CYCLE SIGNALS FROM ONE SIDED INPUT SIGNAL

BACKGROUND OF THE INVENTION

The invention relates to a circuit for deriving signals and counter cycle signals from an one sided input signal.

Such a circuit is known from DE-AS No. 25 44 000, for example. It contains a current reflecting circuit with a low Ohm input and a high Ohm output circuit. The emitter of a first transistor is connected to the output circuit of the current reflecting circuit. The one sided input signal is fed to the base of the transistor, while its collector is connected through a series circuit of at least one impedance with the emitter of a second transistor whose collector forms the cycle output and whose base is connected with a point of a fixed potenetial. The emitter of a third transistor is connected with a second impedance to the input circuit of the current reflecting circuit. The base of the third transistor is connected with the collector of the first transistor, and the collector of the third transistor forms the counter cycle output. Finally, the output circuit of the current reflecting circuit is bridged by a direct current impermeable impedance (capacity).

If it is desired to construct this known circuit in an integrated manner, a total of six connections must be provided on the chip; one each connection for the cycle output and counter cycle output, one connection for the input of the one sided input signal (base of the first transistor), one connection for the point constant potential (base of the second transistor), the substrate connection (mass), as well as a connection for the direct-current impermeable impedance which bridges the output circuit of the current reflecting circuit. Smaller capacities can be easily integrated, but a capacity in the magnitude as would be required for bridging the output circuit of the current reflection circuit cannot be made in an integrated manner, so that a particular connection must be provided.

The number of connections per chip represent a substantial cost factor when mass producing integrated circuits. It is therefore an object of the invention to lower the manufacturing costs with respect to the known state of the art, in that a lower number of connections are provided per chip.

In a circuit for deflecting of signals and counter cycle signals from an one sided input signal with at least one current reflecting circuit at the outputs at which, either the emitters, or the collectors of a first and a second transistor (T1,T2) are coupled, whereby in a connecting line at least one resistor is disposed and whereby the electrode, the collector or the emitter of the one transistor which is not coupled with the current reflection circuit forms the first counter cycle output, this object of the invention is obtained in that the base of the two transistors are coupled with each other and are connected to an adjustable direct-current supply, and that the electrode, the collector or the emitter of the other transistor which is not connected with the current reflecting circuit forms the other counter cycle output.

SUMMARY OF THE INVENTION

In keeping with these objects and others which will become apparent hereafter, one feature of the invention resides, in a circuit for deriving balanced output signals from a one-sided input signal, in a combination which comprises a pair of transistors having interconnected bases and each having a collector-emitter path, a current reflecting circuit, coupling means including at least one resistor for connecting like electrodes of the collector-emitter path of said pair of transistors to said current reflecting circuit, an adjusting direct current supply connected to the interconnected bases of said pair of transistors, input connection provided in said coupling means to receive said one-sided input signal, and output connections provided respectively at the other electrodes of the emitter-collector path of said pair of transistors to tap off said balanced output signal and corresponding output counter cycle signal.

The novel features which are considered characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
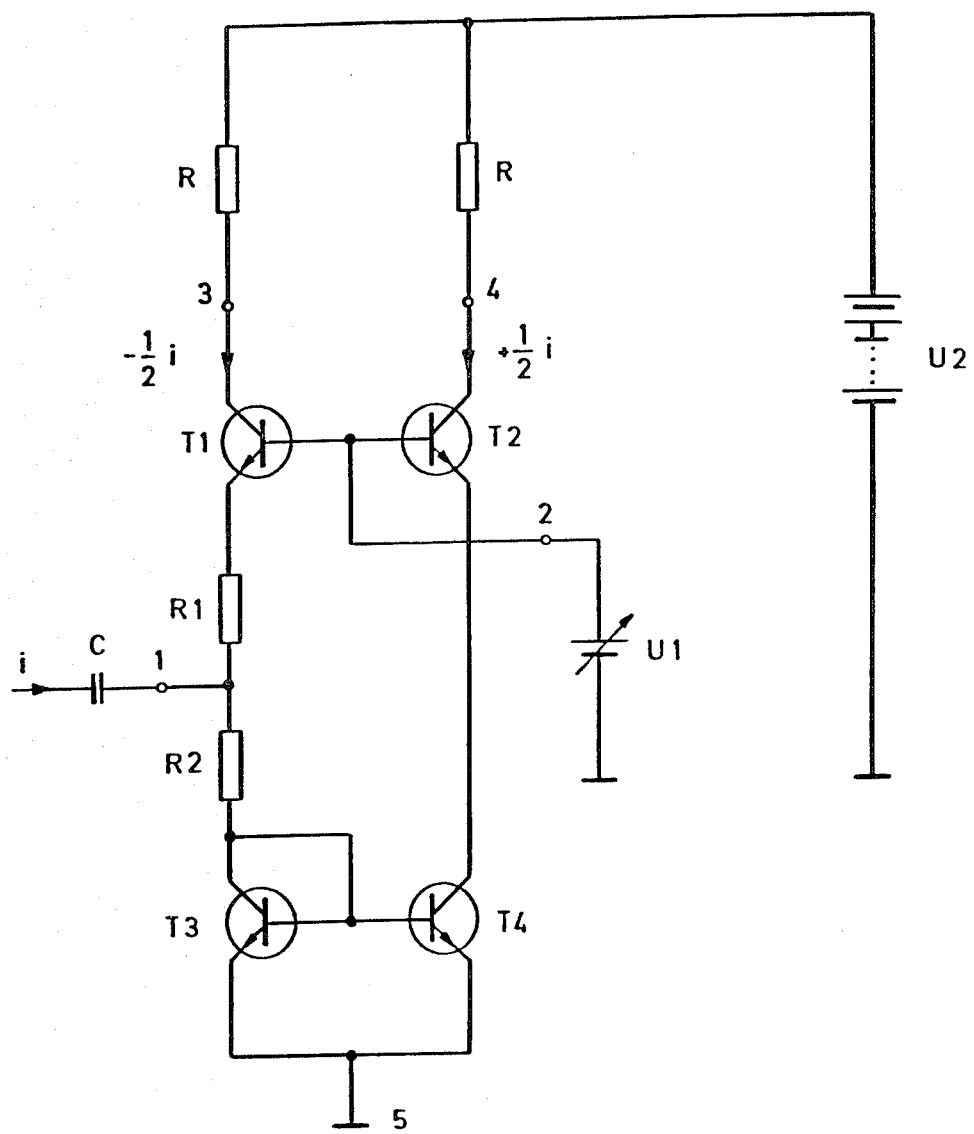
FIG. 1 shows a circuit diagram of a first embodiment of the circuit of this invention.

Referring firstly to FIG. 1, the emitter of the first transistor T1 is connected through a series circuit consisting of two resistors R1 and R2 with the collector of a third transistor T3 whose emitter is connected with the emitter of a transistor T4. The base of each of the third and the fourth transistor T3 and T4 which are connected with each other are connected to a collector of the third transistor T3. The collector of the fourth transistor T4 is connected with the emitter of the second transistor T2. The connected emitters of the third and fourth transistors T3,T4 form the substrate in an integrated structure.

The one sided input signal i is fed to the circuit through the substrate connection 5 and the connection point 1 of the two resistors R1 and R2. The adjustment of the rest direct-current is performed by applying a constant potential to connection point 2 at the connected bases of the first and second transistors T1,T2. This can be carried out by an adjustable voltage source U1, for example, the plus pole of which is connected the corresponding base.

The connecting point 1 of the two resistors R1 and R2, as well as the substrate connection form the connection for the alternating input signal. The current reflecting circuit which is formed in known manner by the transistors T3 and T4 provides that the rest direct-current is almost symmetrically distributed on the collector-emitter-path of the transistor pair T1 and T3, as well as of the transistor pair T2 and T4.

For example, when the direct-current I flows through the collector-emitter-path of the first transistor T1, this direct current will be so distributed on the knot after the second resistor R2 that the base currents $2I_B$ for the third and the fourth transistors T3,T4 are branched off, while the direct-current $I - 2I_B$ flows into the collector of the third transistor T3. By means of the current reflector, this current $I - 2I_B$ which flows into the collector of the fourth transistor T4 is reflected to the collector-emitter-path of the second transistor T2. The direct current $I-I_B$ flows from the emitters of the third and the fourth transistors T3 and T4.

For a better relationship of the direct-current behavior of the inventive circuit, the outer wiring for adjusting the rest direct-current is also shown in FIG. 1, however in the other exemplified embodiments it is omitted for clarity sake. The outer wiring consists of the resistors R and the voltage sources U1 and U2.

The alternating current i of the one sided input signal flows through a capacitor C to the connecting point 1 of resistors R1 and R2. The capacitor C prevents that portions of the rest direct current flow out of the circuit at this connection point. At this point the alternating current i branches off onto the resistors R1 and R2 in reverse proportion to their resistor values. The portion of the alternating current which flows through the resistor R2 is reflected into the emitter of the second transistor T2 due to the current reflector.

Thereafter, for R1=R2 the alternating current $-\frac{1}{2}i$ flows through the collector-emitter-path of the first transistor T1, while through the collector-emitter-path of the second transistor T2 the alternating current $+\frac{1}{2}i$ flows. The input resistance is about equal to the resistance of the parallel circuit of R1 and R2.

In contrast to the state of the art, this exemplified embodiment of the invention requires only five connections for the outer wiring. The collectors of the transistors T1 and T2 form the first and second connection 3 and 4 for the signal and the countersignal, their joint connected base represent the third contact 2 for adjusting the rest direct current, the connecting point of the two resistors R1 and R2 is the fourth connection 1 and serves with the substrate as an input for the one sided input signal for the fifth connection 5.

Figure 2:
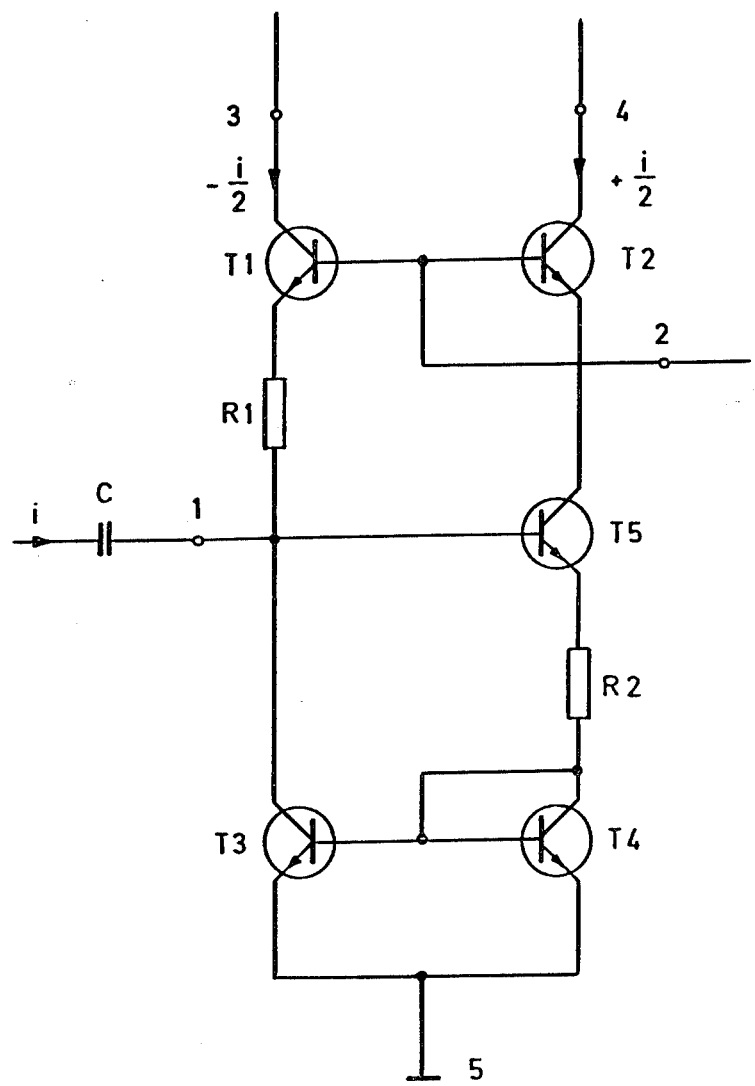
FIGS. 2–5 illustrate simplified circuit diagrams of modifications of the circuit of FIG. 1.

A further exemplified embodiment is shown in FIG. 2 which has improved direct-current symmetry characteristics with respect to the first embodiment.

The emitter of the first transistor T1 is connected through a resistor R1 to the collector of a third transistor T3 whose emitter is connected with the emitter of a fourth transistor T4. The collector of the fourth transistor T4 is connected to the interconnected bases of the third and fourth transistor T3,T4. The collector of the fourth transistor T4 is connected through a resistor R2 with the emitter of the fifth transistor T5 whose base is connected with the collector of the third transistor T3 and whose collector is connected with the emitter of the second transistor T2. The collector and the emitter of the third transistor T3 form the input connection points 1,5 for the one sided input signal i. The collectors of the transistors T1 and T2 form the connections 3 and 4 for the output signal and the output counter cycle signal i the interconnected bases of the same transistors form the connection 2 for the direct-current adjustment.

The potential separation is performed by a capacitor C which is series connected to connection 1, in the same manner as in exemplified embodiment of FIG. 1. The direct-current symmetry is improved by the fifth transistor T5. The direct-current I flows through the collector-emitter-path of the second transistor T2 to the collector of the fifth transsistor T5. At this point the emitter current of the fifth transistor T5 has the magnitude $I+I_B$ and flows through the resistor R2 and branches into the double base current $2I_B$ for transistors T3 and T4, as well as into the collector current $I-I_B$ of the fourth transistor T4. At this point, the emitter current of the fourth transistor T4 has the magnitude I. The emitter current of the third transistor T3 has also the magnitude I, while the collector current of this transistor is $I-I_B$.

In contrast thereto, the current through the collector-emitter-path of the first transistor T1 and through the resistor R1 is I, because the base current $I_B$ flows to the base of the fifth transistor T5 from the connection point for the resistor R1 with the collector of the third transistor T3.

The alternating input current i branches at connection 1 in such a manner that $+\frac{1}{2}i$ flows through the resistor R1 to the connection 3 and $-\frac{1}{2}i$ flows to the collector of the third transistor T3. The fifth transistor T5 which is connected as an emitter follower is controlled by the voltage drop on R1. The emitter current of the fifth transistor T5 is adjusted with the resistor R2. The input resistance of the inventive circuit has the magnitude of about R/2.

Figure 3:
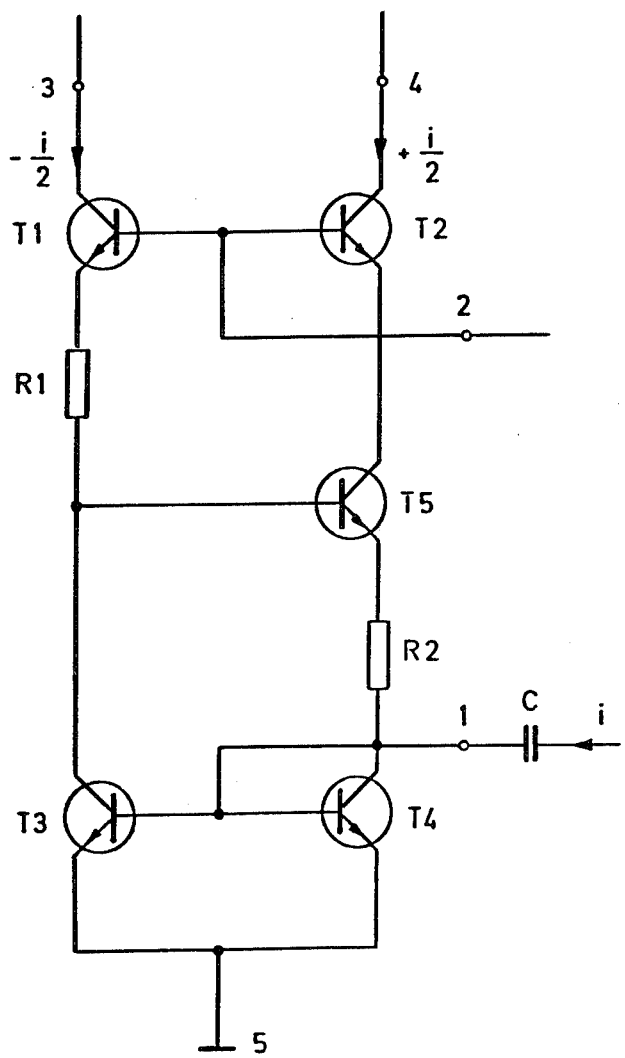

In FIG. 3 a third exemplified embodiment is shown which differs from the circuit of the second example only in that the connection 1 for the one sided input signal is not provided on the collector of the third transistor T3, but on the collector of the fourth transistor T4. In contrast to the second exemplified embodiment, the third example has the advantage of a lower input resistance with a value of about 1:s, whereby s is the steepness of the fourth transistor T4.

Figure 4:
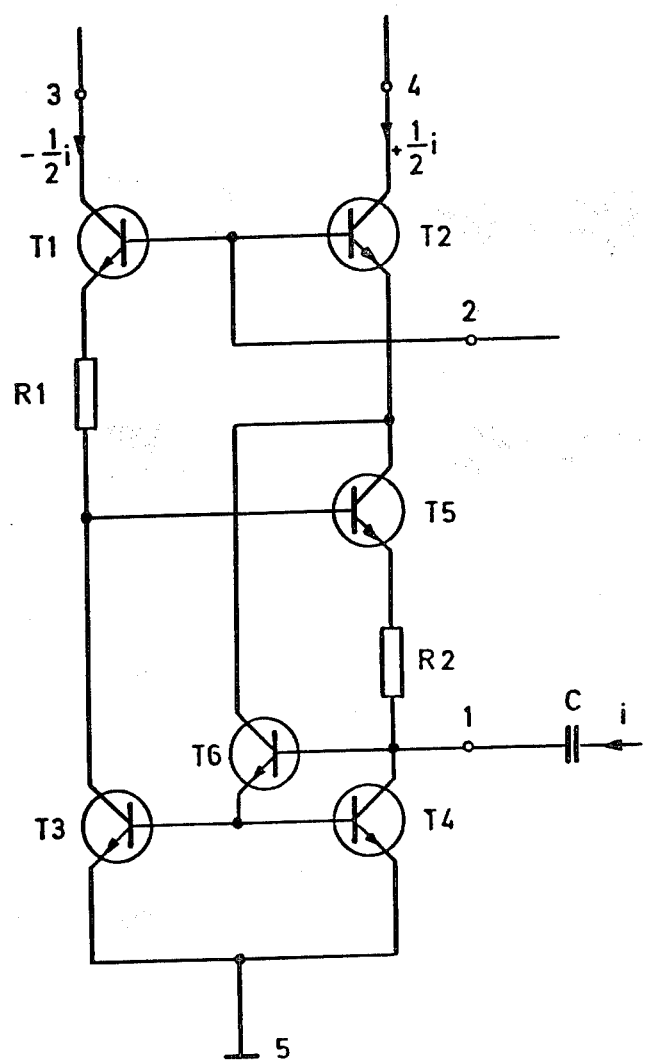

In FIG. 4, a fourth exemplified embodiment is shown. It differs from the third embodiment in that a sixth transistor T6 is provided whose base is connected with the collector of the fourth transistor T4, whose collector is connected with the collector of the fifth transistor T5 and whose emitter is connected to the interconnected bases of transistors T3 and T4.

Compared with the third exemplified embodiment, this embodiment has an improved direct-current symmetry and a lower input resistance.

The input resistance has the magnitude of about 1:(B.s), whereby B is the current amplification of the sixth transistor T6 and s is the steepness of the fourth transistor T4.

Figure 5:
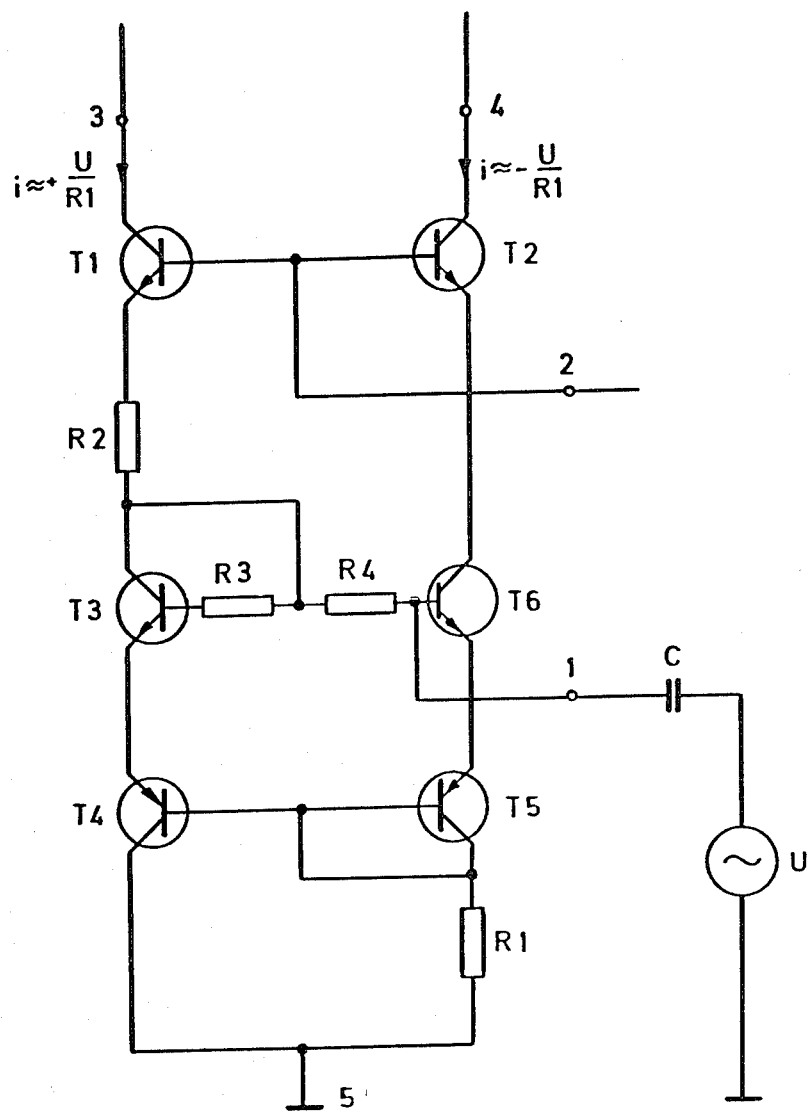

In FIG. 5, a fifth exemplified embodiment is shown which contains two current reflection circuits with transistors of different types of conductivity. The circuitry is constructed as follows: The emitter of the first transistor T1 is connected with a resistor R2 and with the collector of a third transistor T3 whose emitter is connected with the emitter of a fourth transistor T4. The collector of the fourth transistor T4 is connected through a resistor R1 with the collector of a fifth transistor T5 whose collector is connected to the bases of transistors T4,T5. The emitter of the fifth transistor T5 is connected with the emitter of a sixth transistor T6 whose base is connected through a series circuit consisting of two resistors R3,R4 with the base of the third transistor T3. The collector of the third transistor T3 is connected to the center tap of the resistor series circuit R3,R4. The collector of the sixth transistor T6 is connected with the emitter of the second transistor T2. The base of the sixth transistor T6 and the collector of the fourth transistor T4 form the input connections 1,5 for the one sided input signal. Balanced output signal and counter signal are taken from the connections 3 and 4 at the collectors of the transistors T1 and T2.

The two current reflecting circuits formed by the pair of transistors T6,T3, as by well as the pair of transistors T4,T5 are connected in series. Thereby, the input resistance is increased in accordance with the bootstrap principle.

The adjustment of the rest direct current is performed like in all other exemplified embodiments by applying a constant potential to the connection 2 of the interconnected bases of the first and second transistor T1,T2.

In contrast to the aforementioned exemplified embodiments, which are all current controlled, the fifth version is controlled by a voltage U.

All exemplified embodiments require only five connections, including the substrate connection 5 for the outer wiring, in contrast to known circuits, which require at least one additional connection.

What is claimed as new and desired to be protected by Letters Patent is set forth in the appended claims:

1. A circuit for deriving balanced output signals from a one-sided input signal, comprising a pair of transistors having interconnected bases and each including a collector and an emitter electrode defining a collector-emitter path; a current reflecting circuit; coupling means including at least one resistor for connecting two equal electrodes in said collector-emitter paths of said pair of transistors to said current reflecting circuit; an adjustable direct current voltage source connected to the interconnected bases of said pair of transistors; an input connection provided in said coupling means to receive said one-sided input signal; and output connections provided respectively at the other electrodes of said collector-emitter paths of said pair of transistors to tap off an output signal and an output counter-cycle signal.

2. A circuit as defined in claim 1, said pair of transistors including a first transistor and a second transistor and said current reflecting circuit including a third transistor and a fourth transistor, said coupling means including a series connection of two resistors connected between one of said equal electrodes and the collector of said third transistor, said input connection being provided at the connection point of said two resistors, the bases of said third and fourth transistors being connected to the collector of said third transistor and the emitters of the third and fourth transistors being connected to a common connection point whereby all transistors are of the same type of conductivity.

3. Circuit in accordance with claim 2, wherein said current reflecting circuit includes a third transistor and a fourth transistor, the emitter of the first transistor is connected through a resistor with the collector of the third transistor whose emitter is connected with the emitter of the fourth transistor and the collector of the fourth transistor being connected to the bases of the third and fourth transistors, the collector of the fourth transistor being connected through a resistor with the emitter of a fifth transistor whose base is connected with the collector of the third transistor and whose collector is connected with the emitter of the second transistor, the collector of the third transistor being connected to the input connection for the one sided input signal and all said transistors being of the same type of conductivity.

4. Circuit in accordance with claim 2, wherein said current reflecting circuit includes a third transistor and a fourth transistor, the emitter of the first transistor is connected with the collector of the third transistor, the emitter of the third transistor is connected with the emitter of the fourth transistor, the collector of the fourth transistor is connected through a resistor with the collector of a fifth transistor whose collector is connected to the bases of the fourth and fifth transistor, the emitter of the fifth transistor is connected with the emitter of a sixth transistor whose base is connected through a series circuit consisting of two even resistors with the base of the third transistor, the collector of the third transistor is connected with the centre tap of the series circuit of resistors, the collector of the sixth transistor is connected with the emitter of the second transistor, the base of the sixth and the collector of the fourth transistor being connected to the input connection for the one side-input signal, and said first, second, third and sixth transistors being of one type of conductivity and the fourth and fifth transistors being of a different type of conductivity.

5. Circuit in accordance with claim 2, wherein said current reflecting circuit includes a third transistor and a fourth transistor, the emitter of the first transistor is connected through a resistor with the collector of the third transistor whose emitter is connected with the emitter of the fourth transistor and the collector of the fourth transistor is connected to the bases of the third and fourth transistors, the collector of the fourth transistor is connected through a resistor with the emitter of a fifth transistor whose base is connected with the collector of the third transistor and whose collector is connected with the emitter of the second transistor, the collector of the fourth transistor being connected to the input connection for the one-sided input signal and all said transistors being of the same type of conductivity.

6. A circuit as defined in claim 3, further comprising a sixth transistor whose base is connected to the collector of the fourth transistor and whose emitter is connected to the interconnected bases of the third and fourth transistors, the collector of the sixth transistor being connected with the collector of the fifth transistor.

* * * * *